(12) United States Patent
Andersson

(10) Patent No.: US 6,204,792 B1
(45) Date of Patent: Mar. 20, 2001

(54) PING-PONG READOUT

(75) Inventor: Anders Andersson, Pasadena, CA (US)

(73) Assignee: Photobit Corporation, Pasadena, CA (US)

( * ) Notice: Subject to any disclaimer, the term of this patent is extended or adjusted under 35 U.S.C. 154(b) by 0 days.

(21) Appl. No.: 09/270,298

(22) Filed: Mar. 15, 1999

(51) Int. Cl.[7] .................................................. H03M 1/12
(52) U.S. Cl. ......................... 341/155; 348/219; 348/714
(58) Field of Search ........................... 341/155; 348/219, 348/714, 240, 294

(56) References Cited

U.S. PATENT DOCUMENTS 5,452,022 * 9/1995 Yamamoto et al. ................. 348/174
6,018,363 * 1/2000 Horii .................................... 348/219

* cited by examiner

Primary Examiner—Brian Young
Assistant Examiner—John Nguyen
(74) Attorney, Agent, or Firm—Fish & Richardson P.C.

(57) ABSTRACT

A ping-pong A/D converter which produces an output at alternate times on alternate memories.

9 Claims, 1 Drawing Sheet

PING-PONG READOUT

BACKGROUND

In an image sensor, data is produced in output. Sometimes, it is desirable to be able to do various things with the data. Sample and hold units often obtain the information, and output the information as necessary.

SUMMARY

It is an object of the present system to define a circuit that enables reading out pixel data at the same time as analog conversion is occurring. The present system describes the circuit which enables conserving and reading out previous conversion while doing a new conversion.

BRIEF DESCRIPTION OF THE DRAWINGS

These and other aspects of the invention will now be described with reference to the attached drawings, in which.

DESCRIPTION OF THE PREFERRED EMBODIMENT

Figure 1:
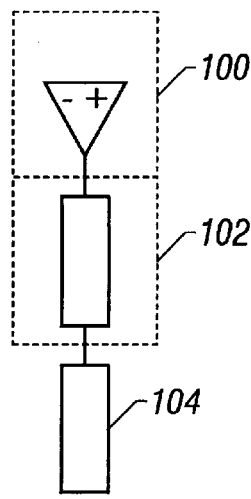
FIG. 1 shows a previous system.

A previous system is shown in FIG. 1. A successive approximation A/D converter 100 performs a successive approximation on the information in register 102. When, but only when, that is finished, the system shifts out the information in 102 to a new register 104. It should be apparent that this system cannot carry out both at the same time.

Figure 2:
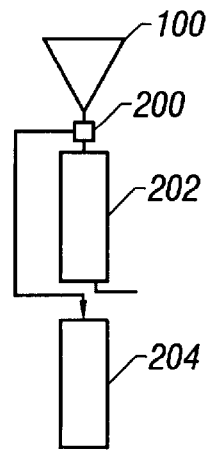
FIG. 2 shows a conceptual embodiment.

The present system, conceptually, uses the operation shown in FIG. 2. The successive approximation A/D converter 100 is connected to two different registers, 202 and 204. A switching unit 206 can be optionally provided to determine which of the units receives the output information. The system operates to produce its output in alternative registers during alternative clock cycles. During odd clock cycles, for example, the successive approximation A/D converter 100 operates on the information in register 202. Then, during the next even clock cycle, the successive approximation device operates on the information in register 204. During that second clock cycle, the information in 202 is completely valid. Therefore, the information can be shifted out while doing a new conversion.

Figure 3:
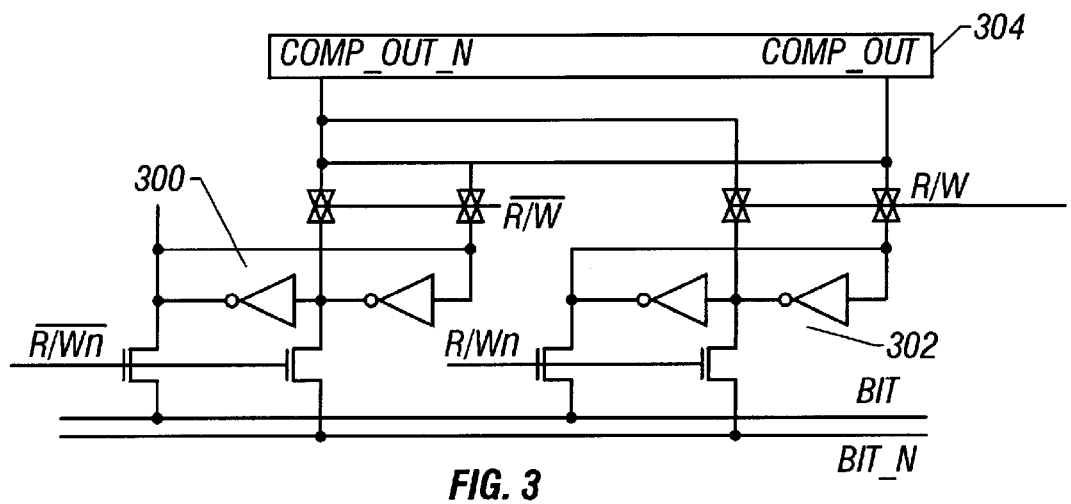
FIG. 3 shows a detailed implementation of the system.

A detailed implementation is shown in FIG. 3. A plurality of bi-directional registers are used. Data is written into the registers row-wise, and readout from the register column-wise. The system is shown in FIG. 3. There are two sets of registers 300 and 302. One is always either in read-mode or write-mode, and the other is always in the opposite mode.

Comparator 304 is the comparator used for conversion in the successive approximation device. The comparator is always connected to these inputs. During analog to digital conversion, the comparator writes directly into the register that is enabled for receiving data for that conversion. At the same time, the opposite register, the one that is dedicated for sending data, is read out during that time. After readout is completed, or after A/D conversion is completed, the read/write signal is switched, so that the previous register where data has been written becomes the writing register, and the previously-writing register becomes the working register for the comparator.

Figure 4:
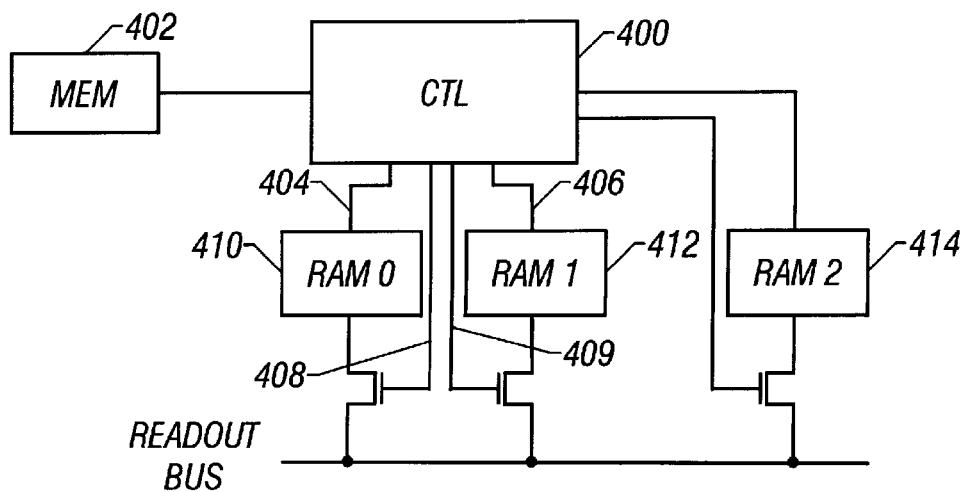
FIG. 4 shows an alternative embodiment.

The system shown in FIG. 3 presupposes that the same read/write signal R/Wn is applied to both registers 300 and 302 so that one is active while the other is not. However, it is also possible to use another embodiment, in which full control to the read/write permission of the different registers is possible. This is shown in FIG. 4. In this figure, the controller 400 operates based on instructions in memory 402 and allows any possibility of read and write control. For example, in a preferred mode of use of FIG. 4, the controller two conversions can be done one after the other by first enabling line 404, then 406. Then both can be read out one after the other by first enabling line 408 then line 410. Any other combination of enables can alternately be used to do this in a different order.

The FIG. 4 embodiment showing use of more than two registers 410, 412, 414 are obtained. This enables doing a plurality of conversions before reading. In the control embodiment described above, the third register 414 could be used while the first two were being read out. In this way, fewer readouts can be used to obtain the same amount of data.

The preferred mode of this system uses an active pixel sensor, i.e., a CMOS image sensor which has a plurality of pixels, each pixel of which is formed from a CMOS image sensor including the photoreceptor, e.g., a photodiode, with an integral transistor element used for buffering inside the pixel. One preferred transistor element, for example, is a source follower element. Each of the CMOS image sensors has integrated, on chip, the A/D converter assembly 100, preferably one of which is for each of the columns.

Although only a few embodiments have been described in detail above, other embodiments are contemplated by the inventor and are intended to be encompassed within the following claims.

What is claimed is:

1. An image sensor device, comprising:

an image sensor;

an A/D converter, connected to said image sensor, to produce a digital output indicative of the analog input thereto; and first and second digital storing elements, selectively connected to said output of said A/D converter, and a controller connected such that said A/D converter uses said first digital storing element during the first A/D conversion period, and during which said second digital storing element has storage contents that are valid, and during a second integration period said A/D converter uses said second digital storing element as a working digital storing element and during which said storage contents in said first digital storing element are valid.

2. A device as in claim 1, wherein said first and second digital storing elements are alternately read out.

3. A device as in claim 1, wherein said first and second digital storing elements are simultaneously read out.

4. A device as in claim 1, wherein said controller produces read/write signals, which indicate which of said digital storing elements is read at any one time.

5. A device as in claim 1, wherein there are a plurality of said digital storing elements.

6. A method for reading out data from an image sensor device, comprising:

first configuring a first A/D converter and a first digital storing element to operate in an A/D conversion mode, and a second A/D converter and a second digital storing element to validate storage contents of said second digital storing element for first output; and second configuring a second A/D converter and a second digital storing element to operate in an A/D conversion mode, and a first A/D converter and a first digital storing element to validate storage contents of said first digital storing element for second output.

7. The method of claim 6, further comprising:

alternately reading out said first and second outputs.

8. The method of claim 6, further comprising:

simultaneously reading out said first and second outputs.

9. The method of claim 6, further comprising:

producing read/write control signals that indicate which of said first and second outputs is read out at any one time.

* * * * *